United States Patent [19]

Wild

[11] Patent Number: 5,310,698
[45] Date of Patent: May 10, 1994

[54] PROCESS FOR PRODUCING AN ARSENIC-DOPED SMOOTH POLYCRYSTALLINE SILICON LAYER FOR VERY LARGE SCALE INTEGRATED CIRCUITS

[75] Inventor: Barbara Wild, Bietigheim-Bissingen, Fed. Rep. of Germany

[73] Assignee: Siemens Aktiengesellschaft, Munich, Fed. Rep. of Germany

[21] Appl. No.: 812,712

[22] Filed: Dec. 23, 1991

[30] Foreign Application Priority Data

Dec. 21, 1990 [EP] European Pat. Off. ........ 90125289.0

[51] Int. Cl.$^5$ ......................................... H01L 21/225
[52] U.S. Cl. .................... 437/160; 437/162; 437/233; 148/DIG. 1
[58] Field of Search .................. 437/14, 101, 160, 162, 437/164, 233, 950, 967, 973; 148/DIG. 1, DIG. 122, DIG. 144

[56] References Cited

U.S. PATENT DOCUMENTS

| | | | |
|---|---|---|---|
| 4,012,235 | 3/1977 | Mayer et al. | 437/160 |
| 4,698,104 | 10/1987 | Barker et al. | 437/247 |
| 4,789,883 | 12/1988 | Cox et al. | 148/DIG. 1 |
| 5,183,777 | 2/1993 | Doki et al. | 437/160 |

FOREIGN PATENT DOCUMENTS

| | | | |
|---|---|---|---|
| 0271072 | 6/1988 | European Pat. Off. | |
| 3504184 | 8/1986 | Fed. Rep. of Germany | 437/233 |
| 59-138332 | 8/1984 | Japan | |
| 61-012031 | 1/1986 | Japan | |
| 0029954 | 2/1988 | Japan | 437/233 |
| 0166220 | 7/1988 | Japan | 437/160 |

OTHER PUBLICATIONS

Gorkum et al., "Controlled Atomic Layer Doping and ALD MOSFET Fabrication in Si", Jap. Jnl. Appl. Phys., vol. 26, No. 12, Dec. 1987, pp. L1933-L1936.

S. M. Sze, VLSI Technology, "Polysilicon", pp. 99-105, 1983.
Journal of Applied Physics, vol. 65, No. 11, Jun. 1, 1989 New York, U.S. pp. 4435-4437.
Applied Physics Letters, vol. 53, No. 10, Sep. 5, 1988 New York, U.S., pp. 902-904.
Applied Physics Letters, vol. 49, No. 7, Aug. 18, 1986 New York, U.S., pp. 382-384.
Applied Physics Letters, vol. 52, No. 17, Apr. 25, 1988 New York, U.S. pp. 1425-1427.
Applied Physics Letters, vol. 55, No. 10, Sep. 4, 1989 New York, U.S., pp. 963-965.
Journal of Applied Physics, vol. 65, No. 6, Mar. 15, 1989 New York, U.S, pp. 2485-2492.
D. Widmann et al: "Technologie hochintegrierter Schaltungen", Springer-Verlag, 1988.
F. C. Eversteyn et al in "Journal of the Electrochemical Society", vol. 120, No. 1, 1973, pp. 106-109.
K. Sawada et al in: "Symp. on VLSI Technology Digest of Techn. Papers", Kyoto, 1989, pp. 41-42.

*Primary Examiner*—Brian E. Hearn
*Assistant Examiner*—C. Chaudhari
*Attorney, Agent, or Firm*—Herbert L. Lerner; Laurence A. Greenberg

[57] ABSTRACT

In a multistage process for producing a smooth polycrystalline silicon layer, in particular a layer with low arsenic doping, for very large scale integrated circuits, by thermal decomposition of gaseous compounds containing the elements, a doped layer and an undoped silicon layer above the doped layer are deposited directly one after the other in a two-stage process. Initially, a surface-covering arsenic layer being at most a few atoms thick, is deposited as a preliminary lining. Then an undoped amorphous silicon layer is deposited on the arsenic layer at a temperature of less than 580° C. Subsequently, the silicon layer is uniformly doped with the arsenic layer serving as a diffusion source, by temperature treatment. Simultaneously, the amorphous silicon is made into a polycrystalline silicon layer.

15 Claims, 2 Drawing Sheets

PROCESS FOR PRODUCING AN ARSENIC-DOPED SMOOTH POLYCRYSTALLINE SILICON LAYER FOR VERY LARGE SCALE INTEGRATED CIRCUITS

BACKGROUND OF THE INVENTION

1. Field of the Invention

The invention relates to a multistage process for producing a smooth polycrystalline silicon layer, in particular one with low arsenic doping, for very large scale integrated circuits, by the thermal decomposition of gaseous compounds containing the elements, in which a doped layer and an undoped silicon layer above the doped layer are deposited directly one after the other in a two-stage process.

The production and use of polysilicon layers in the production of VLSI semiconductor circuits is known, for example, from a book entitled "Technologie hochintegrierter Schaltungen" [Technology of Large Scale Integrated Circuits], 1988, by D. Widmann, H. Mader and H. Friedrich (see particularly section 3.8 and FIG. 5.3.2.). In that book, the use of a (doped) polysilicon layer as a second, upper capacitor electrode in the production of a trench memory cell is also described.

In the development of the very large scale integrated components, such as the 4-megabit DRAM (referred to as "4M"), since the planar cells of the capacitor memory cells require so much space, they are increasingly being replaced with trench cells having a high aspect ratio a (wherein a=the ratio between the cell depth and the cell diameter). For the 4M, the trenches are selected with an aspect ratio of greater than or equal to three. Above all, the use of such trench cells leads to a gain in surface area and thus to a larger scale of integration, if the cells are to be disposed as close as possible to one another. In order to ensure that the electrical properties are not impaired by dense packing of the trench cells, it is necessary for the 4M that the n+ doping (arsenic) of the first, lower capacitor electrode surround the trench with a high surface concentration but low penetration depth. Such a steep doping profile is necessary in order to avoid an electrical punch-through during operation in the later trench cell.

In the 4M, in order to produce a capacitor memory cell after etching of the trench, it was previously conventional (see FIG. 5.3.2. of the aforementioned book) to use the doped monocrystalline silicon substrate directly as the first, lower capacitor electrode. The doping can, for instance, be performed by a process known from Published European Application No. 0 271 072, in which an auxiliary layer of arsenosilicate glass is first deposited, then the arsenic dopant is diffused into the silicon substrate by tempering and the auxiliary layer is finally removed again. A thin $SiO_2$ layer is typically then applied on the highly n+ doped monocrystalline silicon electrode. The second, upper capacitor electrode is finally formed by a polysilicon electrode that simultaneously serves to fill up the trench. Since undoped polysilicon layers have very high impedance, doping is necessary. In principle, either in-situ doping during the polysilicon deposition, for example by the admixture of arsine ($AsH_3$) with the silane ($SiH_4$) typically used for the deposition, or the application of an additional auxiliary layer and ensuing driving-in of the dopant are necessary and possible. However, with a view toward providing an even higher scale of integration than that for the 4M, in the further course of the process the trench is already partially filled enough to result in an increase of the scale being no longer possible.

In order to make the 16-megabit DRAM, a trench-to-trench spacing of approximately 0.8 μm was specified. In order for there to be no overlapping of the space charge zones at that very close spacing, the diffusion regions of the trench had to either be separated from one another by an insulating layer, or the diffusion regions had to be kept quite flat. In both cases, the monocrystalline silicon substrate can no longer directly serve to form the lower capacitor electrode. A separate electrically conductive layer must instead be deposited for that purpose. It is only then that the ONO dielectric (triple layer of silicon oxide [O] and silicon nitride [N]) and the upper polysilicon electrode can be produced as in the 4M. On one hand, the new lower electrode must have the smoothest possible surface, so that the vulnerable dielectric will undergo no loss in quality, and on the other hand the entire doping must not be above $10^{20}$ atoms per $cm^3$, so that the ensuing process steps are not impaired, for instance by overly high growth rates of the ONO bottom oxide.

The last-mentioned requirement could be met by doping by diffusion from an arsenic glass layer, but that would necessitate several additional process steps, or in other words it would lengthen the process time. Only arsenic is possible as a doping element, because phosphorus has a relatively high diffusion coefficient and would generate overly extended diffusion regions in the trench side walls. Regarding the necessary surface quality of the new capacitor electrode, because of its particular structure, polycrystalline silicon is known to have a rough surface, while amorphous silicon, which can be deposited at a temperature below 590° C., has a completely smooth surface. It is also known that at temperatures above 1000° C., silicon layers deposited onto silicon wafers assume the crystal orientation of the monocrystalline silicon substrate (epitaxia).

As already mentioned, in order to avoid additional process steps, it is recommended to use in-situ doping of silicon layers, in which the quantity of silane necessary for depositing the layer is introduced into the reactor simultaneously with the dopant gas. However, undesirable interactions arise in that case, which lead to a change in the deposition rates and a non-uniform incorporation of the dopant over the length of the reactor. An article by F. C. Eversteyn et al, in the Journal of the Electrochemical Society, Vol. 120, No. 1, 1973, also teaches that particularly when arsine is used as the dopant gas, a preferential adsorption of the arsine over silane occurs at the hot wafer surface. In that kind of process, the deposition rate also decreases sharply, but a relatively high quantity of arsenic ($>>10^{20}$ atoms per $cm^3$) is simultaneously incorporated. That process is therefore unsuitable for producing the novel capacitor electrodes, the demand for which is discussed above.

An article by K. Sawada, in the Symposium on VLSI Technology Digest of Technical papers, Kyoto 1989, pp. 41–42, introduced a dual-stage process, in which a phosphorus-doped polysilicon layer was combined with an undoped polysilicon layer deposited immediately after it, so that the decreased deposition rate has less bearing on the results. Tempering produces a virtually homogeneously doped total layer. However, in that process as well, when arsine is used, overly highly doped silicon layers are produced, as corresponding tests have shown. Other tests showed that even if a doped amorphous silicon layer is combined with an undoped amorphous silicon layer deposited immediately thereafter, the mean total concentration of the arsenic remains above $10^{20}$ atoms per cm$^3$, or in other words it is too high for the intended application. Although in principle it is possible to reduce the arsenic concentration by increasing the thickness of the undoped silicon layer, that would not lead to industrially desirable layer thicknesses of approximately 100 nm and below. Moreover, after the tempering, the layer surface produced by the method of K. Sawada is markedly rougher than what is typical for normal amorphous silicon deposition.

SUMMARY OF THE INVENTION

It is accordingly an object of the invention to provide a process for producing an arsenic-doped smooth polycrystalline silicon layer for very large scale integrated circuits, which overcomes the hereinafore-mentioned disadvantages of the heretofore known methods of this general type, which leads to a conforming and homogeneously doped polysilicon layer, and which on one hand has a smooth surface and on the other has an arsenic concentration limited to a maximum of $10^{20}$ atoms per cm$^3$, yet without requiring an overly high layer thickness.

With the foregoing and other objects in view there is provided, in accordance with the invention, in a multistage process for producing a smooth polycrystalline silicon layer, in particular a layer with low arsenic doping, for very large scale integrated circuits, by thermal decomposition of gaseous compounds containing the elements, in which a doped layer and an undoped silicon layer above the doped layer are deposited directly one after the other in a two-stage process, the improvement which comprises:
 a) initially depositing a surface-covering arsenic layer being at most a few atoms thick, as a preliminary lining,
 b) then depositing an undoped amorphous silicon layer on the arsenic layer at a temperature of less than 580° C.,
 c) subsequently uniformly doping the silicon layer with the arsenic layer serving as a diffusion source, by temperature treatment, and
 d) simultaneously making the amorphous silicon into a polycrystalline silicon layer.

In accordance with another mode of the invention, there is provided a process which comprises repeating steps a) and b) at least once before carrying out steps c) and d).

In accordance with a further mode of the invention, there is provided a process which comprises carrying out step a) in a range of substantially from 13 to 20 Pa and preferably substantially from 13 to 16 Pa.

In accordance with an added mode of the invention, there is provided a process which comprises depositing the layers in each of steps a) and b) at a temperature between approximately 550° and 580° C.

In accordance with an additional mode of the invention, there is provided a process which comprises carrying out steps a) and b) at the same temperature.

In accordance with yet another mode of the invention, there is provided a process which comprises adjusting the quantity of deposited arsenic by adjusting the duration of the deposition of the preliminary lining in step a).

In accordance with yet a further mode of the invention, there is provided a process which comprises adjusting the thickness of the undoped silicon layer deposited in step b) to produce a polysilicon layer having an arsenic concentration of approximately $10^{19}$ to $10^{20}$ atoms per cm$^3$.

In accordance with a concomitant mode of the invention, there is provided a process which comprises carrying out the deposition in step a) with a 1% arsine-in-silane gas mixture and preferably carrying out the deposition in step b) with a silane/argon gas mixture.

The deposition of arsenic-doped amorphous silicon by preliminarily lining with arsenic and temporally separate, but immediately ensuing silicon deposition, in other words without the wafers leaving the reactor, is a suitable process for producing low-doped silicon layers with good edge coverage and good surface quality.

As mentioned above, in the preliminary lining step, initially only a 1% arsine-in-silane mixture, for instance, is carried through the reactor at low pressure (13–20 Pa) for a predetermined period of time. This produces a very thin (approximately one monolayer), highly arsenic-doped layer. This step is followed by the deposition of undoped amorphous silicon. In the ensuing tempering, the amorphous silicon crystallizes out to form polysilicon, and the arsenic diffuses to a limited extent into the undoped silicon layer. Although the amorphous silicon layer crystallizes in the temperature treatment, its smooth surface is largely preserved.

The process according to the invention also has a number of advantages over the prior art:
 through the duration of the preliminary lining and the thickness of the undoped layer, the layer resistance and the total doping can be adjusted over a range of from $5 \times 10^{18}$ to $10^{20}$ atoms per cm$^3$;
 the homogeneity of the doping is markedly better than with simultaneous deposition and is not as dependent on the geometry of the boat and reactor, because the arsine can spread out very well at the low preliminary lining pressure. The edge coverage in the trench is also better than otherwise with in-situ-doped processes;
 aside from a short start-up phase after the lining with arsenic, the deposition rate is almost as high as with normal amorphous silicon deposition, that is the process times are within the usual range;
 the bottom oxide of the triple dielectric first grows on a low-doped or undoped underlay, since the arsenic only slowly diffuses out of the preliminary lining layer to the surface; the oxidation rate is thus independent of the target doping.

A further important advantage results from the fact that because of the undoped deposition, all of the arsine that is given up from the reactor surface is bound in the silicon. As the boat leaves the reactor, no arsine can travel into the ambient air during unloading or from the coated quartz parts. The reduced danger of contamination contributes substantially to the safety of the process.

The at least two-stage process according to the invention (in other words, a process with at least one preliminary lining/deposition cycle) makes it possible, on 50 six-inch wafers, to produce arsenic-doped silicon with very good edge coverage and such a smooth surface that it can be used as a polyelectrode beneath the ONO dielectric. In comparison with doping through out-diffusion from arsenic glass, several process steps can be dispensed with. Filling of the trenches in one step is also possible with this process. Since the trench is very narrow, particularly in its lower part, the upper polyelectrode fills the trench entirely at that location, so that this region can no longer be doped by phosphorus diffusion. An arsenic-doped silicon layer serves as a substitute, which is additionally doped with phosphorus only in the upper portion in order to improve the conductivity. Other features which are considered as characteristic for the invention are set forth in the appended claims.

Although the invention is illustrated and described herein as embodied in a process for producing an arsenic-doped smooth polycrystalline silicon layer for very large scale integrated circuits, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawing.

DESCRIPTION OF THE PREFERRED EMBODIMENT

Figure 1:
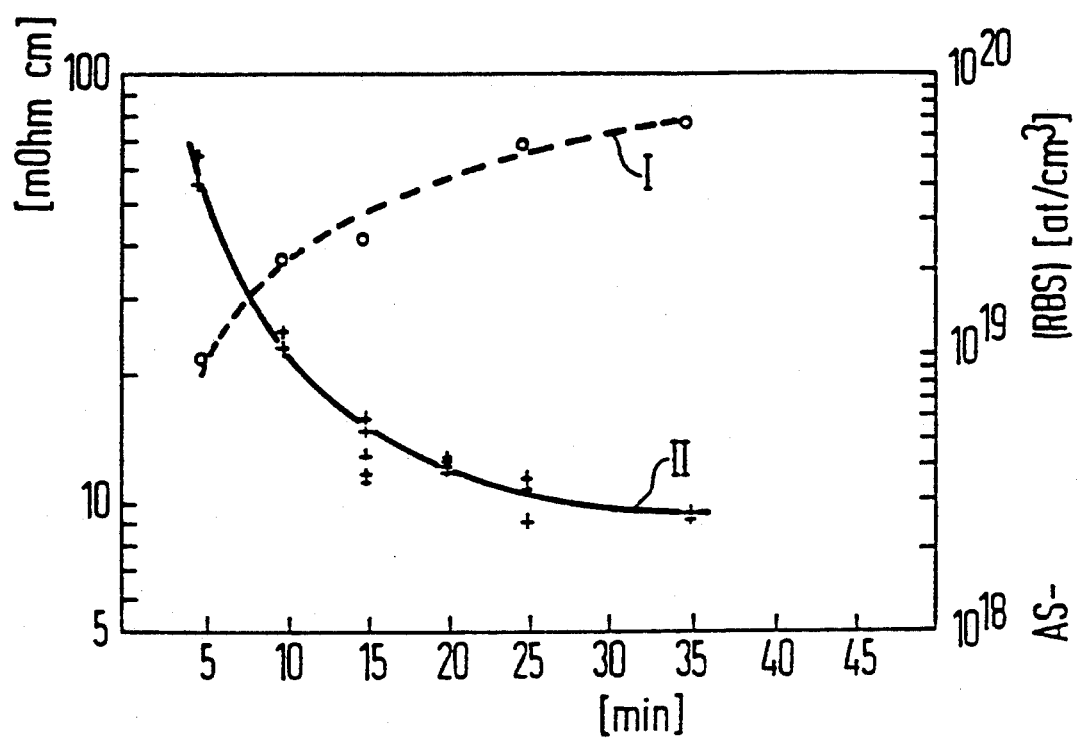
FIG. 1 is a diagram illustrating the influence of a preliminary lining time on layer resistance and on arsenic concentration for an exemplary embodiment of the invention.
Figure 2:
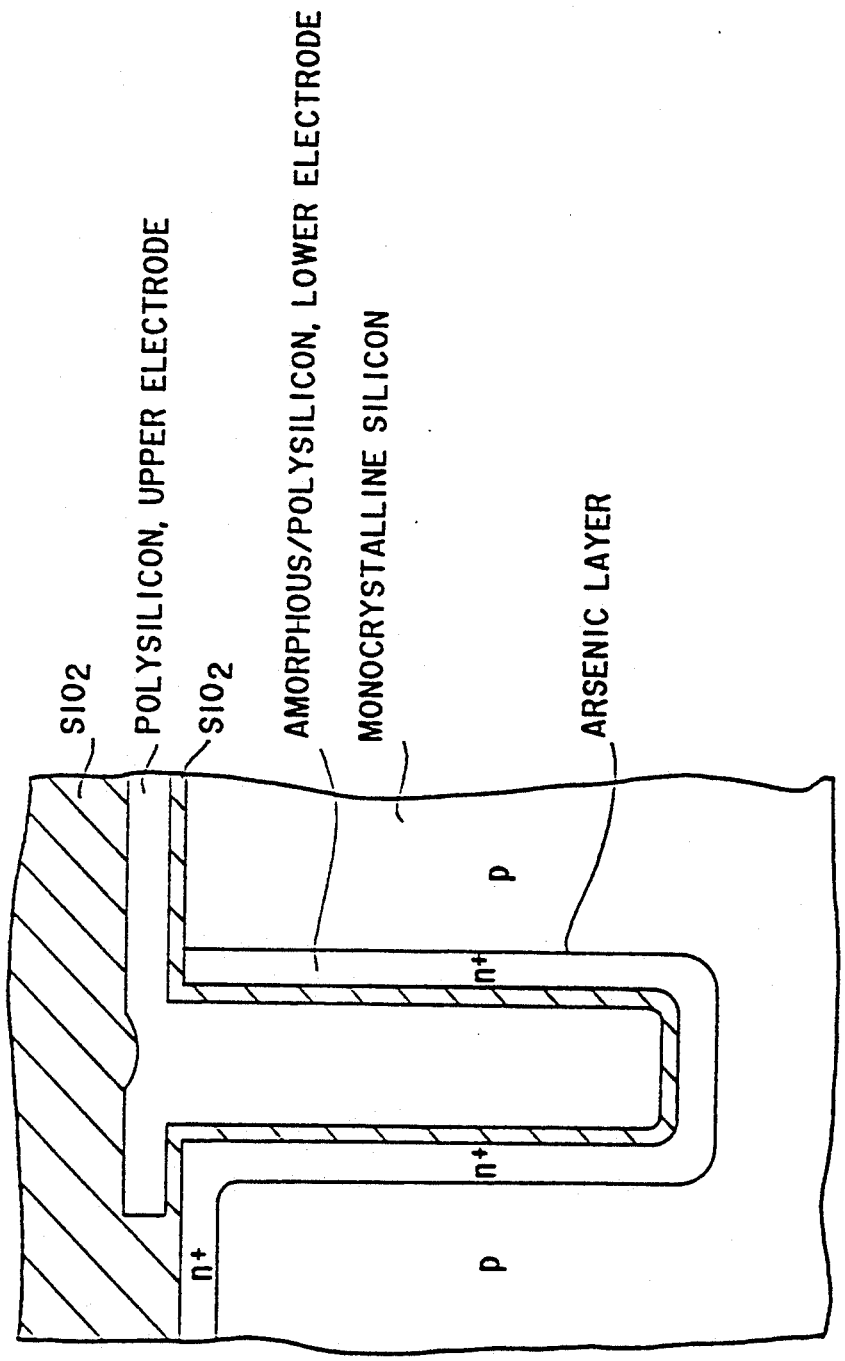
FIG. 2 is a cross-sectional view of a structure according to the invention.

Before discussing the drawing in detail, it is noted that the process is carried out in a horizontal LPCVD reactor. In order to attain adequate doping uniformity, a conventional covered boat or "cage boat" with an adapted hole distribution is used. Without this boat, the so-called "bull's eye" effect occurs. In other words, there is an overly radial dopant gradient over the wafer. The maximum capacity of the boat is 60 wafers at a spacing of 8.9 mm. The distribution of the arsine/silane mixture is controlled through a so-called double injector, which is also known. This injector includes a glass tube having a process tube length, which is closed on one end and has a diameter of approximately 12 mm, that is thrust into the process tube and connected to a gas feed line. In the region that comes to rest under the boat, there is a number of holes, 1 mm wide, through which the gas can flow out. Located in the interior of the injector is a capillary having the same length, through which through a second process gas line gas can be carried into the front part of the injector. Through the use of an advantageous distribution of the gas quantity to the two injector feeds, the gas distribution over the length of the boat can be optimized. The process gases are silane, argon, and 1% arsine in silane.

It has been found that in the preliminary lining, a relatively thick layer (20 to 30 nm) grows even at an only slightly increased pressure (such as 50 Pa). This layer probably is formed of a silicon layer with a high arsenic content and is thus unsuitable for the target process. The lower the pressure becomes, the more uniform the preliminary lining becomes, particularly when introduction is provided through the inner injector. At 30 sccm and a pressure of 13 to 16 Pa, the preliminary lining layer is virtually immeasurably thin, yet quite uniform over the length of the tube and over the wafer.

A typical process flow is carried out in accordance with the following chart:

---

Introducing wafers (60 pieces) into a special boat at T = 500° C.
Pumping out the reactor, flushing, first leak test
Flushing with 1 l nitrogen
Heating to process temperature (approx. 550 to 580° C.)
for 30 min
Pumping out and second leak test (1 min)
Deposition of arsenic-containing preliminary lining:
30 sccm arsine/silane through injector
at p = 13-20 Pa, max. 30 min
Pumping out
Deposition of an undoped Si layer
thickness between 40 and 300 nm,
150 sccm silane, 180 sccm argon at p = 106 Pa
3 × pumping (5 minutes) and flushing (5 minutes), in the
course of lowering the temperature to 500° C.
Running out the boat at T = 500° C., cooling in the
protective tube

---

The process conditions and the duration of the preliminary lining determine the total arsenic quantity to be found later in the silicon layer. In order to attain uniform arsenic lining both over the boat and over the wafer, a low preliminary lining pressure 13 to 20 and preferably 16 Pa has proved advantageous, as already mentioned. For practical reasons, the same temperature as for the later undoped deposition was selected. Taking these peripheral conditions into account, it is recommended that the quantity of deposited arsenic be controlled primarily through the duration of the lining process. This makes it easy to adapt the process to various specifications, similarly to controlling the layer thickness over the time.

Referring now to FIG. 1 of the drawing in detail, there is seen a graph which illustrates the influence of the preliminary lining time on the arsenic concentration (curve I) and on the layer resistance (curve II) in a 150 nm-thick layer after tempering (lining condition at T=550° C. and p=13 Pa, with tempering at 900° C. for one hour). It was discovered that only some (approximately 40 to 50%) of the arsenic diffuses into the crystallizing silicon layer, while the rest remains at the boundary surface. This is adequate to produce arsenic concentrations of $5 \times 10^{18}$ to $10^{20}$ atoms per cm$^3$ in the layer. Precisely this doping range is optimal for the present application. It should also be noted that after approximately 30 minutes, a saturation effect in terms of (the growth and thickness of) the preliminary lining ensues.

The deposition conditions for the undoped amorphous layer were selected in such a way that the best possible amorphousness is attained. Optimal results were attained at a pressure of 87 to 106 Pa at a silane partial pressure of approximately 38 to 45 Pa (dilution with argon). Particularly good results in terms of the surface roughness were attained at a deposition temperature in the preliminary lining of 555° C. and a pressure of not substantially more than 87 Pa in the undoped deposition. Since the production of a lower capacitor electrode is more critical with a view toward providing the surface quality, the lower deposition pressure of 87 Pa was selected for that part of the process, while the upper, thicker and more uncritical polyelectrode is deposited at 106 Pa.

It was also demonstrated that the process according to the invention is "robust" in the sense that a flushing step of 30 minutes can be built in between the preliminary lining step and the silicon deposition. The layers produced in this way nevertheless have the same layer resistances as in the process without flushing. A reduced arsenic concentration from evaporation does not occur.

The process according to the invention accommodates a number of possible variations. For instance, by repeating the preliminary lining and the undoped deposition, even thicker layers, such as 600 nm (preliminary lining and deposition twice each) or 900 nm (preliminary lining and deposition three times each), can be produced. In order to attain higher doping, the thickness of the undoped silicon layer can be reduced. For instance, a 300-nm layer that had a layer resistance of 7 mOhm×cm was produced by respective preliminary lining and 150 nm undoped deposition (otherwise, the figure is 20 MOhms×cm).

I claim:

1. A multistage process for producing a smooth polycrystalline silicon layer for very large scale integrated circuits by thermal decomposition of gaseous compounds, which comprises:
   a) initially depositing a surface-covering arsenic layer being at most a few atoms thick, as a preliminary lining,
   b) then depositing an undoped amorphous silicon layer on the arsenic layer at a temperature of less than 580° C.,
   c) subsequently uniformly doping the silicon layer with the arsenic layer serving as a diffusion source, by temperature treatment, and
   d) simultaneously making the amorphous silicon into a polycrystalline silicon layer.

2. The process according to claim 1, which comprises repeating steps a) and b) at least once before carrying out steps c) and d).

3. The process according to claim 1, which comprises carrying out step a) in a range of substantially from 13 to 20 Pa.

4. The process according to claim 2, which comprises carrying out step a) in a range of substantially from 13 to 20 Pa.

5. The process according to claim 1, which comprises carrying out step a) in a range of substantially from 13 to 16 Pa.

6. The process according to claim 2, which comprises carrying out step a) in a range of substantially from 13 to 16 Pa.

7. The process according to claim 1, which comprises depositing the layers in each of steps a) and b) at a temperature between approximately 550° and 580° C.

8. The process according to claim 2, which comprises depositing the layers in each of steps a) and b) at a temperature between approximately 550° and 580° C.

9. The process according to claim 1, which comprises carrying out steps a) and b) at the same temperature.

10. The process according to claim 2, which comprises carrying out steps a) and b) at the same temperature.

11. The process according to claim 1, which comprises adjusting the quantity of deposited arsenic by adjusting the duration of the deposition of the preliminary lining in step a).

12. The process according to claim 1, which comprises adjusting the thickness of the undoped silicon layer deposited in step b) to produce a polysilicon layer having an arsenic concentration of approximately $10^{19}$ to $10^{20}$ atoms per $cm^3$.

13. The process according to claim 1, which comprises carrying out the deposition in step a) with a 1% arsine-in-silane gas mixture.

14. The process according to claim 13, which comprises carrying out the deposition in step b) with a silane/argon gas mixture.

15. A two-stage process for producing a smooth polycrystalline silicon layer with low arsenic doping for very large scale integrated circuits by thermal decomposition of gaseous compounds containing the elements, which comprises:
   a) initially depositing a doped surface-covering arsenic layer being at most a few atoms thick, as a preliminary lining,
   b) then immediately depositing an undoped amorphous silicon layer directly on the arsenic layer at a temperature of less than 580° C.,
   c) subsequently uniformly doping the silicon layer with the arsenic layer serving as a diffusion source, by temperature treatment, and
   d) simultaneously making the amorphous silicon into a polycrystalline silicon layer.

* * * * *